United States Patent
Tong et al.

(10) Patent No.: US 6,743,707 B2
(45) Date of Patent: Jun. 1, 2004

(54) BUMP FABRICATION PROCESS

(75) Inventors: Ho-Ming Tong, Taipei (TW); Chun-Chi Lee, Kaohsiung (TW); Jen-Kuang Fang, Pingtung Hsien (TW); Min-Lung Huang, Kaohsiung (TW); Jau-Shoung Chen, Hsinchu Hsien (TW); Ching-Huei Su, Kaohsiung (TW); Chao-Fu Weng, Tainan (TW); Yung-Chi Lee, Kaohsiung (TW); Yu-Chen Chou, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 10/248,163

(22) Filed: Dec. 23, 2002

(65) Prior Publication Data

US 2003/0124833 A1 Jul. 3, 2003

(30) Foreign Application Priority Data

Dec. 31, 2001 (TW) ........................................ 90133197 A

(51) Int. Cl.[7] ........................... H01L 21/48; B23K 31/02
(52) U.S. Cl. ................... 438/612; 438/613; 228/180.22
(58) Field of Search ............................... 228/178, 179.1, 228/180.1, 180.21, 180.22; 438/106, 108, 612, 613, 614, 615, 342, 343, 349; 29/832, 840, 842, 843; 257/737, 738, 778, 779, 780, 781

(56) References Cited

U.S. PATENT DOCUMENTS

| | | | | |
|---|---|---|---|---|
| 4,514,751 A | * | 4/1985 | Bhattacharya | 257/737 |
| 5,384,283 A | * | 1/1995 | Gegenwarth et al. | 438/614 |
| 5,496,770 A | * | 3/1996 | Park | 438/613 |
| 5,631,499 A | * | 5/1997 | Hosomi et al. | 257/737 |
| 5,846,875 A | * | 12/1998 | Haji | 438/614 |
| 5,903,058 A | * | 5/1999 | Akram | 257/778 |
| 6,452,270 B1 | * | 9/2002 | Huang | 257/738 |
| 6,548,386 B1 | * | 4/2003 | Kondo et al. | 438/572 |

FOREIGN PATENT DOCUMENTS

| | | | | |
|---|---|---|---|---|
| JP | 60045041 A | * | 3/1985 | H01L/21/92 |
| JP | 03171631 A | * | 7/1991 | H01L/21/321 |

* cited by examiner

*Primary Examiner*—Alonzo Chambliss
(74) *Attorney, Agent, or Firm*—Jiang Chyun IP Office

(57) ABSTRACT

The present invention provides a bump fabrication process. A wafer is provided with a patterned photoresist layer formed on the wafer. The patterned photoresist layer has a plurality of openings, corresponding to bonding pads. A conductive layer is formed on the photoresist layer and the exposed bonding pads. Afterwards, a sticker film is the provided to lift off the conductive layer on the photoresist layer, while the conductive layer within the openings is not removed. A solder paste is filled into the openings. A reflow step is performed to turn the filled solder paste into globular bumps. At last, the protoresist layer is removed.

10 Claims, 8 Drawing Sheets

BUMP FABRICATION PROCESS

CROSS REFERENCE TO RELATED APPLICATIONS

This application claims the priority benefit of Taiwan application serial no. 90133197, filed Dec. 31, 2001.

BACKGROUND OF INVENTION

1. Field of Invention

The present invention relates to a fabrication process for forming bumps. More particularly, the present invention relates to the lift-off technology for forming the under bump metallurgy layer in the bump fabrication process.

2. Description of Related Art

At present, the market of multimedia applications rapidly expands. The integrated circuit (IC) packaging needs to be improved following the developing trends of electronic devices such as digitalization, network localization, and user friendliness. In order to meet the above requirements, electronic devices must have multiple functions and high integration, and maintain high operating speed, miniaturization, lightweight, and low cost. High-density packages, such as ball grid arrays (BGAs), chip scale packages (CSPs), flip chips, and multi-chip modules (MCMs) have been developed. The integrated circuit packaging density is determined by the degree of numbers of pins per area unit. For high-density IC packaging, the signal transmitting speed increases as the wiring length decreases. Thus, the application of bumps has become the main trend in the high-density packaging.

FIGS. 1–7 are cross-sectional views illustrating a conventional fabrication process for forming bumps. Referring to the FIG. 1, a wafer 100 is provided with a bonding pad 102 and a protective layer 104. The protective layer 104 protects a surface of the wafer and exposes a surface of the bonding pad 102.

Referring to FIG. 2, a photoresist layer 106 having an opening 108 is formed over the wafer 100. The location of the opening 108 corresponds to the locations of the bonding pad 102, so as to expose the surface of the bonding pad 102. The opening 108 has a structure similar to an undercut (an undercut structure), for example.

Referring to FIG. 3, a conductive layer 109 is formed over the wafer 100 covered with the photoresist layer 106. The conductive layer 109 includes an adhesion layer 110a, a barrier layer 110b, and a wetting (solder) layer 110c. Because of the photoresist layer, the adhesion layer 110a, the barrier layer 110b and the wetting (solder) layer 110c are located on both the bonding pad 102 and the photoresist layer 106. On the other hand, the adhesion layer 110a, the barrier layer 110b and the wetting layer 110c are not present on sidewalls of the opening 108.

Referring to FIG. 4, the photoresist layer 106 is stripped along with the adhesion layer 110a, the barrier layer 110b and the wetting layer 110c on the photoresist layer 106. Therefore, after stripping the photoresist layer, the adhesion layer 110a, the barrier layer 110b and the wetting layer 110c remaining on the bonding pad 102 becomes an under bump metallurgy (UBM) layer 110.

Referring to FIG. 5, after forming the UBM layer 110 on the bonding pad 102, a photoresist layer 112 is formed over the wafer 100 with an opening 114. The opening 114 corresponds to the UBM layer 110, thus exposing the UBM layer 110.

Referring to FIG. 6, a solder paste 116 is filled into the opening 114 of the photoresist layer 112 by electroplating or screen printing.

Referring to FIG. 7, after filling the solder paste, the photoresist layer 112 is stripped and a reflow step is performed, so that the solder paste 116 becomes a globular bump 118.

In the conventional bump fabrication process, the adhesion layer, the barrier layer and the wetting layer on the photoresist layer are removed with the photoresist layer. Subsequently, another mask process is required to define the locations of bump formation. Usually, one mask process further includes dehydration bake, priming, soft bake, exposure, post exposure bake, development, hard bake and etching. Thus, one extra mask process can greatly increase the production cost for the bumps.

SUMMARY OF INVENTION

The present invention provides a bump fabrication process by using the lift-off technology for lifting off the conductive layer on the photoresist layer, so that the photoresist layer can be used to further define the formation locations of bumps, thus saving one mask process.

Accordingly, the bump fabrication process of the present invention comprises the following steps. A wafer is provided with a patterned photoresist layer formed on the wafer. The patterned photoresist layer has a plurality of openings that expose bonding pads on the wafer. A conductive layer is formed on the photoresist layer and the exposed bonding pads. Afterwards, a sticker film is provided to peel off the conductive layer on the photoresist layer, while the conductive layer within the openings is not removed. A solder paste is filled Into the openings. A reflow step is performed to turn the solder paste filled in the openings into globular bumps. Alternatively, the ball mounting method is used to form bumps. At last, the photoresist layer is removed.

As embodied and broadly described herein, the adhesion between the film and the conductive layer is stronger than the adhesion between the conductive layer and the photoresist layer. The sticker film is, for example, an adhesive tape or other mechanism that can peel the conductive layer from the photoresist layer.

The conductive layer is a stacked layer comprising an adhesive layer, a barrier layer and a wetting layer.

As embodied and broadly described herein, the conductive layer comprises a layer selected from the following group consisting of a titanium-tungsten/nickel-vanadium/copper layer, an aluminum/nickel-vanadium/copper layer, a titanium/nickel-vanadium/copper layer, and a chromium/nickel-vanadium/copper layer. However, the conductive layer should be easily peeled by the sticker film, while the conductive layer adheres well to the bonding pads.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

FIGS. 8–14 are cross-sectional views illustrating steps of a bump fabrication process according to one preferred embodiment of this invention.

Figure 1:
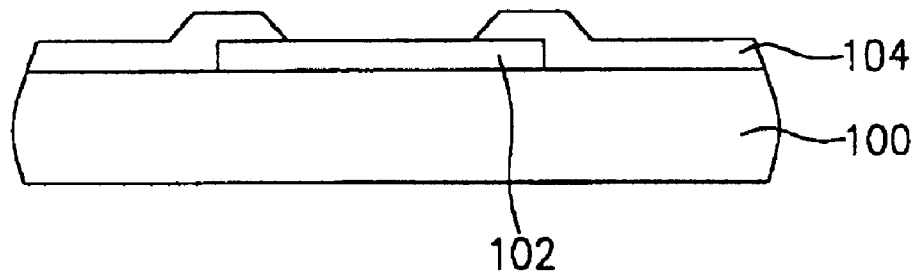
FIGS. 1–7 are cross-sectional views illustrating a conventional fabrication process for forming bumps.
Figure 2:
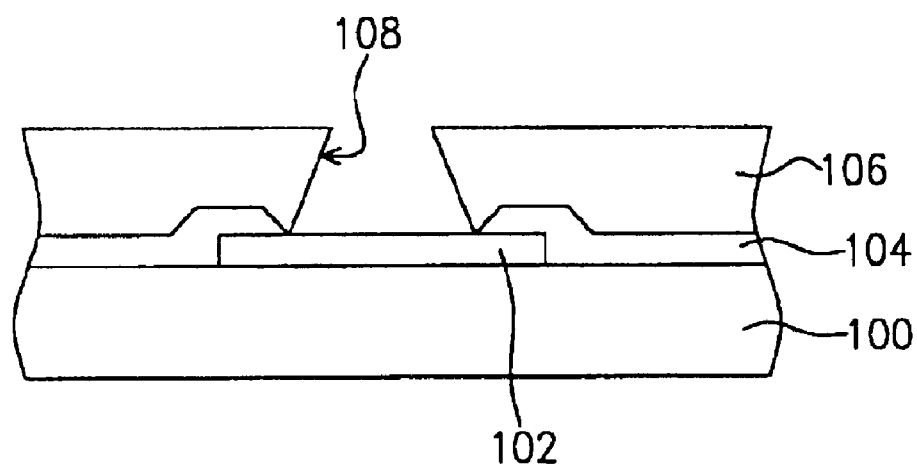
Figure 3:
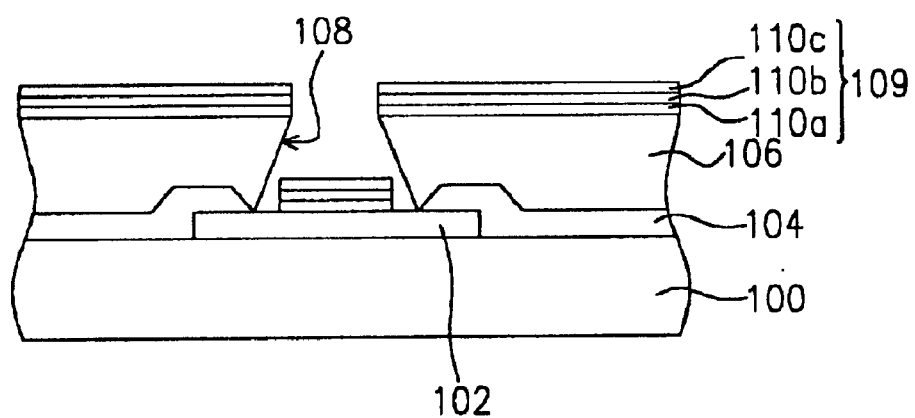
Figure 4:
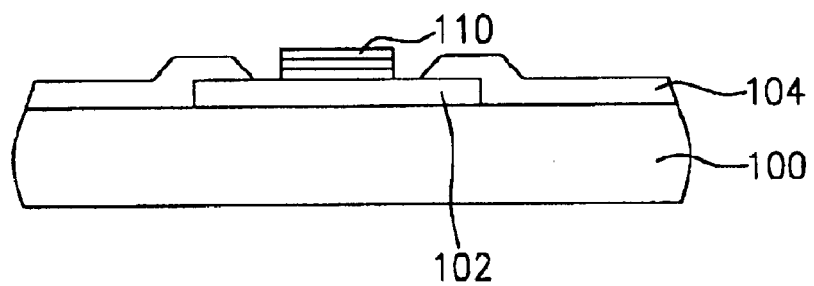
Figure 5:
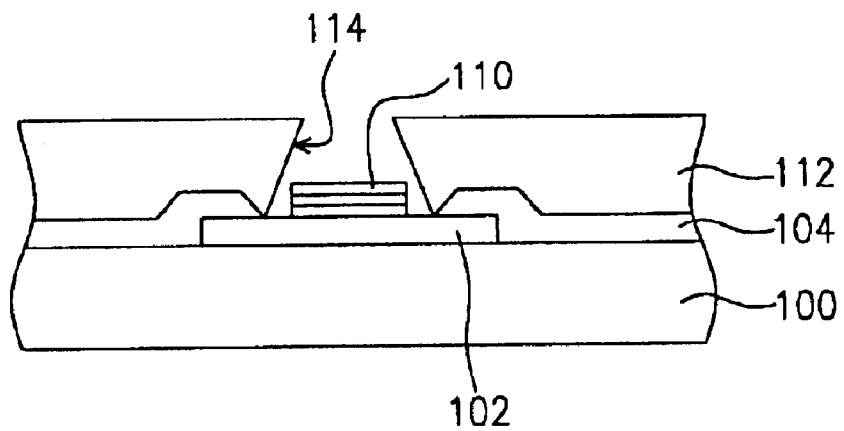
Figure 6:
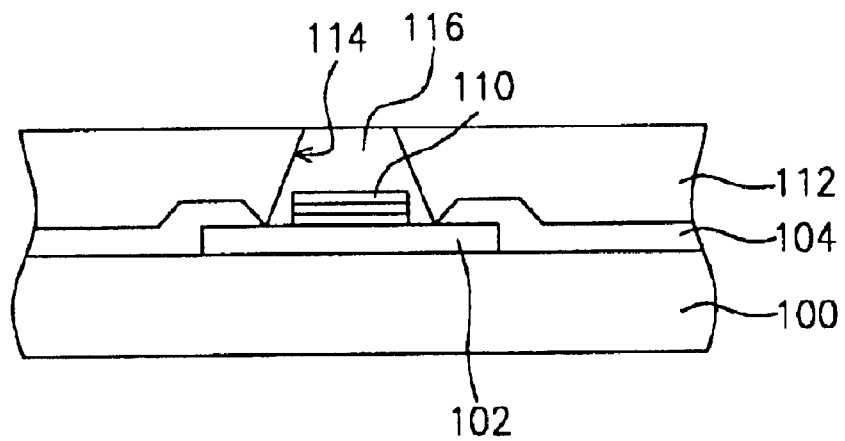
Figure 7:
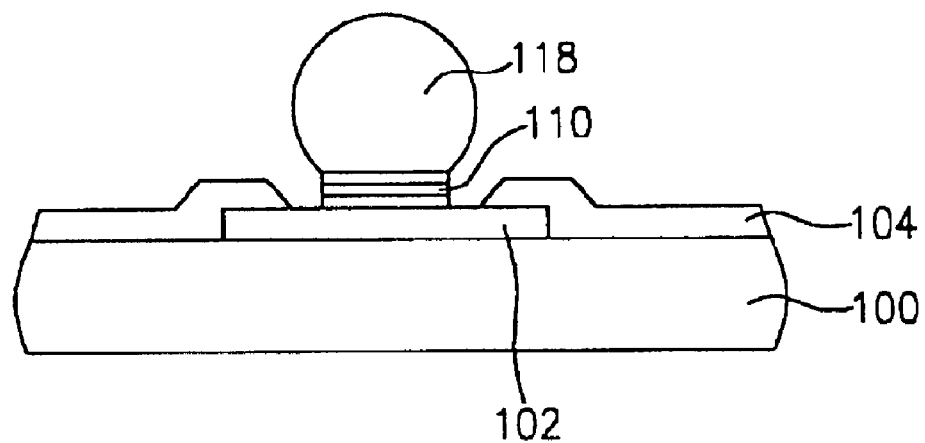
Figure 8:
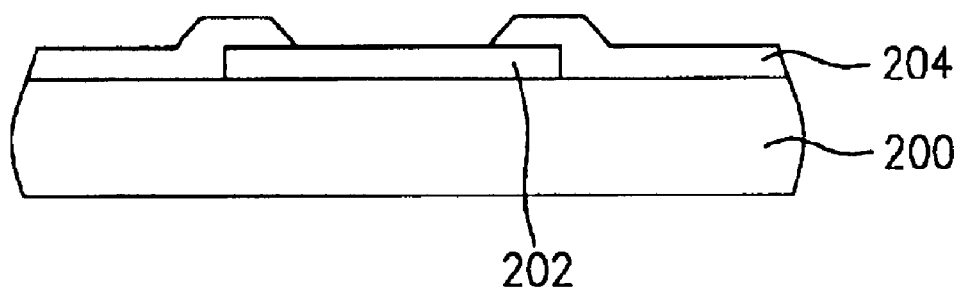
FIGS. 8–14 are cross-sectional views illustrating steps of a bump fabrication process according to one preferred embodiment of this invention.

Referring to the FIG. 8, a substrate or wafer 200 is provided with a bonding pad 202 and a protective (passivation) layer 204. The protective layer 204 is disposed on the wafer 200, protecting a surface of the wafer 200 and exposing a surface of the bonding pad 202. The bonding pad 202 can be an aluminum pad or a copper pad, for example.

Figure 9:
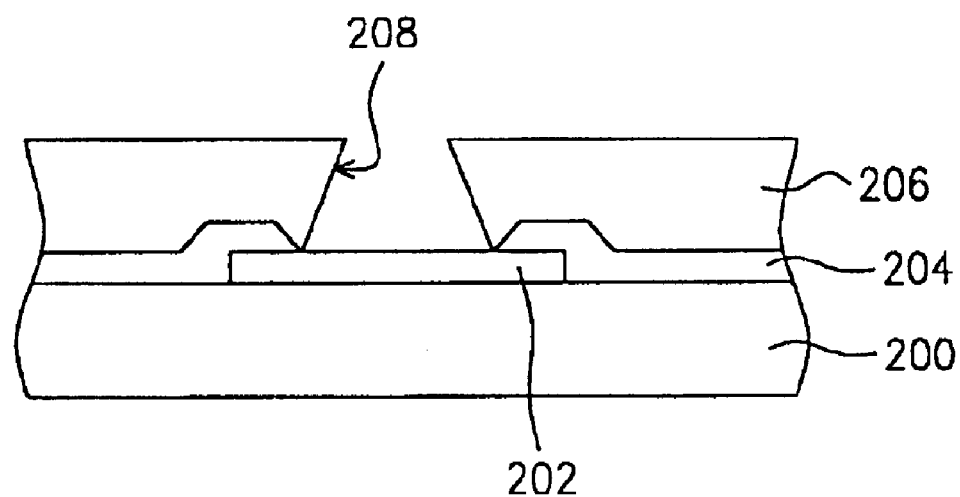

As shown in FIG. 9, a photoresist layer 206 having an opening 208 is formed over the wafer 200. The location of the opening 208 corresponds to the location of the bonding pad 202, so as to expose the surface of the bonding pad 202. The opening 208 has a structure similar to an undercut (an undercut structure), for example.

Figure 10:
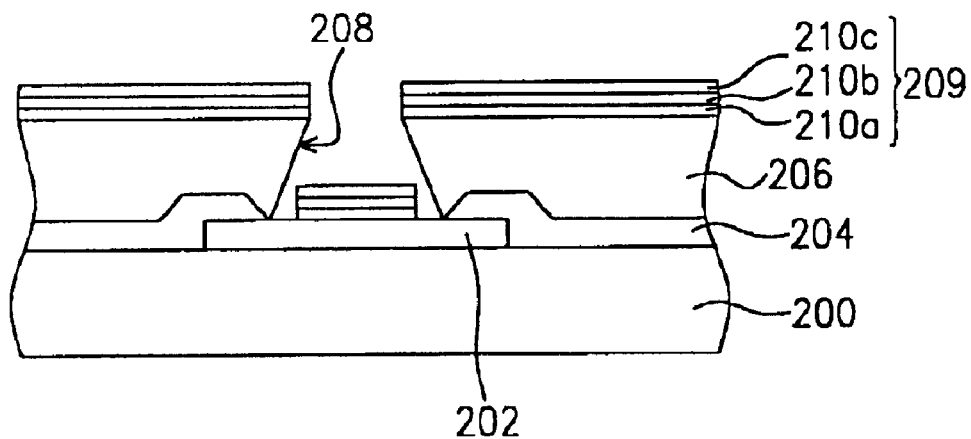

Referring to FIG. 10, a conductive layer 209 is formed over the wafer 200 and on the photoresist layer 206. The conductive layer 209 includes an adhesion layer 210a, a barrier layer 210b, and a wetting (solder) layer 210c. Due to the pattern (opening) of the photoresist layer, the adhesion layer 210a, the barrier layer 210b and the wetting (solder) layer 210c are located on both the bonding pad 202 and the photoresist layer 206. On the other hand, the adhesion layer 210a, the barrier layer 210b and the wetting layer 210c are not present on sidewalls of the opening 208. That is, the conductive layer 209 (the adhesion layer 210a, the barrier layer 210b and the wetting layer 210c) is disconnected because of the interruption of the opening 208.

Figure 11:
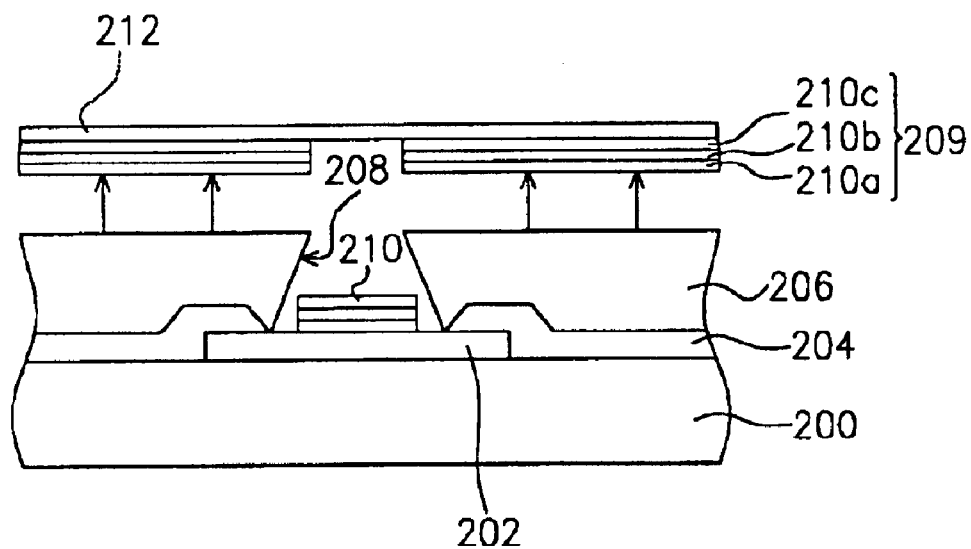

Referring to FIG. 11, a sticker film 212, for example, an adhesive tape, is formed on the wetting layer 210c. The sticker film 212 is adhered to the wetting layer 210c, so as to lift the adhesion layer 210a, the barrier layer 210b and the wetting layer 210c that are situated on the photoresist layer 206 from the photoresist layer 206. Therefore, after lifting off the conductive layer 209 from the photoresist layer 206, the adhesion layer 210a, the barrier layer 210b and the wetting layer 210c remaining on the bonding pad 202 becomes an under bump metallurgy (UBM) layer 210. The adhesion between the sticker film 212 and the wetting layer 210c must be stronger than the adhesion between the adhesion layer 210a and the photoresist layer 206. Therefore, the material of the adhesion layer 210a is preferably chosen to have weaker adhesion toward the photoresist layer 206. Depending on the materials of the adhesion layer 210a, various materials can be used for forming the barrier layer 210b and the wetting layer 210c. In the preferred embodiment, the UBM layer 210 can be a stacked layer of titanium-tungsten/nickel-vanadium/copper (TiW/NiV/Cu), chromium/nickel-vanadium/copper (Cr/NiV/Cu), aluminum/nickel-vanadium/copper (Al/NiV/Cu), or titanium/nickel-vanadium/copper (Ti/NiV/Cu), for example.

Figure 12:
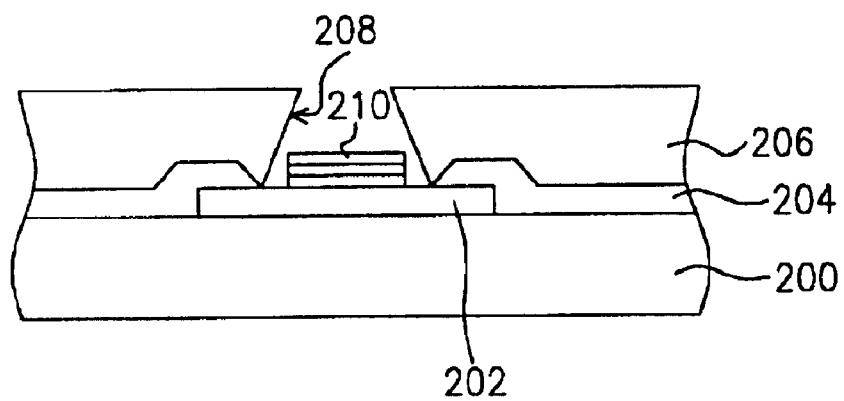

Referring to FIG. 12, after peeling the adhesion layer 210a, the barrier layer 210b and the wetting layer 210c from the photoresist layer 206, the photoresist layer 206 remains over the wafer 200 with the opening 208. The opening 208, exposing the UBM layer 210, corresponds to the formation location of the bump. Therefore, the photoresist layer 206 can be further used to define the location for subsequently forming the bump.

Figure 13:
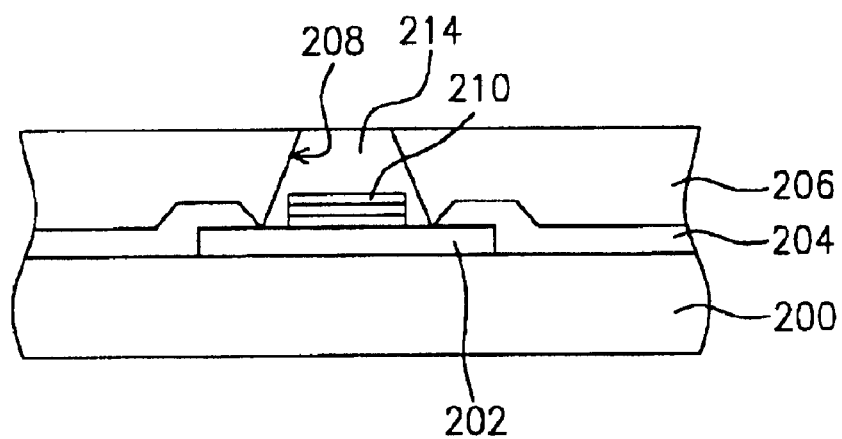

Referring to FIG. 13, a solder paste 214 is filled into the opening 208 of the photoresist layer 206 by, for example, electroplating, screen printing or other technology. There is no misalignment issue occurring because the same photoresist layer 206 defines the UBM layer 210 and the location filled by the solder paste 214.

Figure 14:
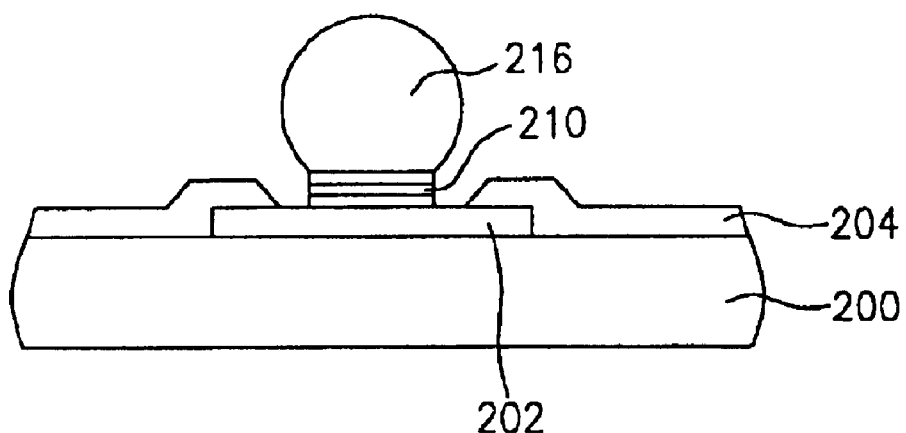

Referring to FIG. 14, after filling the solder paste 214, the photoresist layer 206 is removed. After removing the photoresist layer 206, a reflow step is performed to turn the filled solder paste 214 into a globular bump 216 Alternatively, the ball mounting method can be used to form bumps and a reflow step is performed to fix the bumps.

In conclusion, the bump fabrication process of the present invention has at least the following advantages:

(1) By using the sticker film to remove the adhesion layer, the barrier layer and the wetting layer from the photoresist layer, the photoresist layer is retained and can be used again in the following process of solder paste filling.

(2) In the bump fabrication process of the present invention, the same photoresist layer is used to define the UBM layer and the location filled by the solder paste, thus reducing one extra mask process (another photoresist layer).

(3) There is no misalignment issue because the same photoresist layer defines the UBM layer and the location filled by the solder paste.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A bump fabrication process, comprising:

providing a wafer with a surface having a plurality of bonding pads and a passivation layer thereon, wherein the passivation layer covers the surface and exposes the bonding pads;

forming a photoresist layer having a plurality of openings over the wafer, wherein the openings correspond to the bonding pads;

forming at least a conductive layer on the bonding pads and the photoresist layer, wherein portions of the conductive layer are on the photoresist layer and other portions of the conductive layer are on the bonding pads, and the portions and the other portions of the conductive layer are on different levels above the wafer;

forming a film on the portions of the conductive layer on the photoresist layer;

lifting off the film so as to remove the conductive layer from the photoresist layer and leave the other portions of the conductive layer on the bonding pads;

forming a plurality of bumps on the bonding pads by filling a solder into each of the openings;

performing a reflow step to fix the bumps onto the bonding pads; and removing the photoresist layer.

2. The process of claim 1, wherein the film comprises an adhesive tape.

3. The process of claim 1, wherein a first adhesion between the film and the conductive layer is stronger than a second adhesion between the conductive layer and the photoresist layer.

4. The process of claim 1, wherein the conductive layer comprises an adhesive layer, a barrier layer and a wetting layer.

5. The process of claim 1, wherein the conductive layer comprises a layer selected from the following group consisting of a titanium-tungsten/nickel-vanadium/copper layer, an aluminum/nickel-vanadium/copper layer, a titanium/nickel-vanadium/copper layer, and a chromium/nickel-vanadium/copper layer.

6. A method for forming an under bump metallurgy (UBM) layer, comprising:

providing a wafer with a surface having a plurality of bonding pads and a passivation layer thereon, wherein the passivation layer covers the surface and exposes the bonding pads;

forming a photoresist layer having a plurality of openings over the wafer, wherein the openings correspond to the bonding pads;

forming at least a conductive layer on the bonding pads and the photoresist layer, wherein portions of the conductive layer are on the photoresist layer and other portions of the conductive layer are on the bonding pads, and the portions and the other portions of the conductive layer are on different levels above the wafer;

forming a film on the portions of the conductive layer on the photoresist layer; and lifting off the film so as to remove the conductive layer from the photoresist layer and leave the other portions of the conductive layer on the bonding pads.

7. The method of claim 6, wherein the film comprises an adhesive tape.

8. The method of claim 6, wherein a first adhesion between the film and the conductive layer is stronger than a second adhesion between the conductive layer and the photoresist layer.

9. The method of claim 6, wherein the conductive layer comprises an adhesive layer, a barrier layer and a wetting layer.

10. The method of claim 6, wherein the conductive layer comprises a layer selected from the following group consisting of a titanium-tungsten/nickel-vanadium/copper layer, an aluminum/nickel-vanadium/copper layer, a titanium/nickel-vanadium/copper layer, and a chromium/nickel-vanadium/copper layer.

* * * * *